United States Patent [19]

Hamano

[11] 4,406,987

[45] Sep. 27, 1983

[54] CHARGE LEVEL SENSOR

[75] Inventor: Toshihisa Hamano, Ebina, Japan

[73] Assignee: Fuji Xerox Co., Ltd., Tokyo, Japan

[21] Appl. No.: 245,841

[22] Filed: Mar. 20, 1981

[51] Int. Cl.³ ............................................. G01R 29/12
[52] U.S. Cl. .................................. 324/457; 355/3 CH
[58] Field of Search ................ 324/457, 71 SN, 76 R, 324/72, 173, 149, 174, 175, 60 C, 452, 71 R, 453, 454, 455, 456; 355/3 CH, 14 CH; 354/3; 357/30, 23 D; 361/235

[56] References Cited

U.S. PATENT DOCUMENTS 3,207,982  9/1965  Rose ..................................... 324/149
3,684,364  8/1972  Schmidlin ........................... 361/235

Primary Examiner—Michael J. Tokar
Assistant Examiner—Kevin O'Shea
Attorney, Agent, or Firm—Sughrue, Mion, Zinn, Macpeak and Seas

[57] ABSTRACT

A charge level sensor in which the distance between the sensor and a sample to be sensed is maintained constant and the sensor is entirely protected from strain or contamination by foreign matter and is reduced in size. A rotary drum of aluminum is provided with plural recesses therein in which are disposed charge sensors, preferably MOS FET's. Holes are formed though the substrate leading into the recesses through which pass lead wires coupled to the sensors. The surface of the substrate, including the sensors, is covered by an electric-charge retaining layer such as a photosensitive material or a dielectric material.

10 Claims, 5 Drawing Figures

CHARGE LEVEL SENSOR

BACKGROUND OF THE INVENTION

The present invention relates to a charge level sensor for use in electrophotography, electrostatic recording or the like.

Conventionally, in measuring the level of electric charge, there has been employed a method of using a vibrating-reed electrometer or a method of directly measuring a level of electric charge with a Faraday gauge. These methods, however, are disadvantageous as a practical matter because such an electrometer or gauge is large and costly for the above-mentioned applications. Furthermore, the results of such measurements are dependent on the distance between a sample and the sensor and are greatly influenced by strain on the sensor or foreign matter on or in the sensor. For these reasons, the above-described sensors are not practical for use as charge level sensors for an electrostatic image.

SUMMARY OF THE INVENTION

It is accordingly an object of the present invention to provide a charge level sensor, wherein the distance between the sensor and the sample is maintained constant, with little or no risk that the sensor can be strained or foreign matter can interfere with the sensor, and which is reduced in size and is less costly than prior art sensors.

A feature of the present invention resides in that a recess is provided in the surface of a substrate which forms a rotary member and a charge level sensor is provided in the recess.

More specifically, the objects of the invention are met by providing a substrate, such as aluminum, which forms a rotary member such as a drum. A plurality of recesses are formed in the outer surface of this substrate in which are positioned charge level sensors which are preferably MOS FET's. An electric-charge retaining layer is formed over the surface of the substrate including the charge level sensors. The electric-charge retaining layer may be a photosensitive material or a dielectric material. Holes are formed from the recesses extending through the substrate through which leads are connected to the sensors.

DESCRIPTION OF THE PREFERRED EMBODIMENTS

The present invention will be described with reference to the accompanying drawings which illustrate preferred embodiments of the invention.

Figure 1:
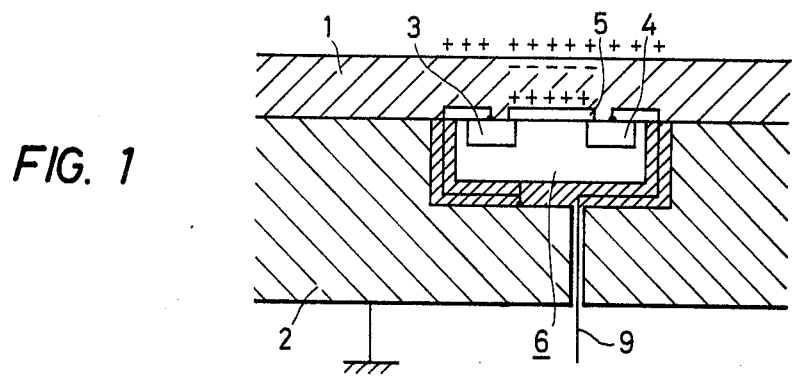
FIG. 1 is a cross-sectional view of a preferred embodiment of a charge level sensor of the present invention.

Referring first to FIG. 1, an electric charge retaining layer 1 is formed of, for example, a photosensitive material or a dielectric material. Shown at 2 is a substrate of a rotary member such as a drum, belt or the like formed of aluminum, and at 3, 4 and 5 a source, a drain and a gate of a FET, respectively. The FET constitutes the charge level sensor 6. The charge level sensor 6 is embedded in the substrate 2, as seen in FIG. 1. The source 3 is connected to the substrate and through the substrate to ground. A $V_{DD}$ lead wire connected to the drain 4 passes through a hole provided in the substrate 2 to be led out to the exterior of the substrate.

As a charge level sensor, a known MOS FET is most suitable. As is well known, the drain voltage $V_D$-drain current $I_D$ characteristic of a MOS FET depends on the gate voltage $V_G$. In accordance with the invention, the gate voltage $V_G$ is determined by the amount of electric charge on the electric charge retaining layer 1 which faces the sensor 6. The level of electric charge on the electric charge retaining layer 1 corresponds to the drain current $I_D$. Therefore, if a reference $V_G$-$I_D$ curve is beforehand obtained with the drain voltage $V_D$ maintained fixed and the drain current $I_D$ measured, then the gate voltage $V_G$ can be determined on the basis of the measured drain current $I_D$ and hence the level of electric charge can be determined from the gate voltage $V_G$ thus obtained.

Figure 2:
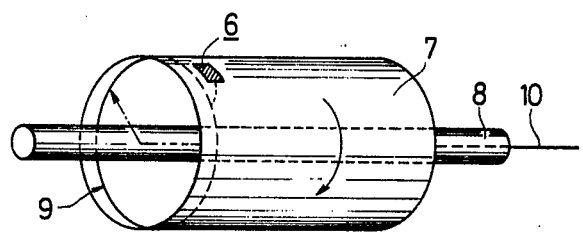
FIGS. 2 and 3 are perspective view of rotary members incorporating a charge level sensor according to the present invention.

FIG. 2 shows one technique for leading the $V_{DD}$ wire from the rotary member. The $V_{DD}$ lead wire 9 connected to the drain of the charge level sensor 6 runs around the inner periphery of the rotary member 7 and is led out to the exterior of the rotary member and brush contact is made with a lead wire 10 provided on the stationary shaft 8. As an alternative, an electrode may extend around the inner periphery of the rotary member 7 separately of the $V_{DD}$ lead wire 9, and the $V_{DD}$ lead wire 9 connected to the electrode. Otherwise, an electrode which contacts the electrode extending around the inner periphery of the rotary member 7 may be provided separately of the lead wire 10 so that the aforesaid electrode and the lead wire 10 may be connected to each other in actual use.

The drain current $I_D$ flowing through the lead wire 10 is fed back, for example, to a control microcomputer thereby to control a bias voltage applied to the charge electrode, a transfer corotron, and a precleaning corotron, for stabilization of a quality of image.

Since the charge level sensor according to the present invention is of an embedded type, variations in the distance between the electric charge retaining layer and the sensor, which would be caused by the eccentricity of the drum in the conventional sensor, are entirely eliminated. The sensor surface is protected by the charge retaining layer so that the sensor can operate stably without risk of being strained or being contaminated by foreign matter. Furthermore, an amplifying circuit may be formed with ease on the semiconductor chip together with the MOS sensor with the result that a sensor minimized in size is obtained.

According to the present invention, the size of the sensor can be made as small as a few microns so that the sensor can be used for measuring solid images as well as a line image density.

Figure 3:
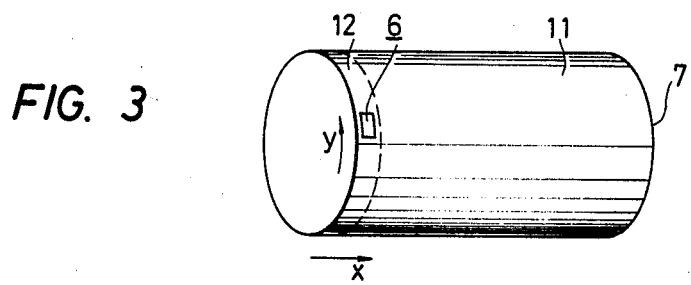
Figure 4A:
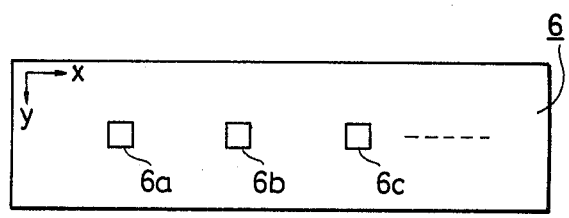
FIG. 4A and FIG. 4B are an explanatory view showing the relationship between the placement of charge level sensors and a line image and an original image.
Figure 4B:
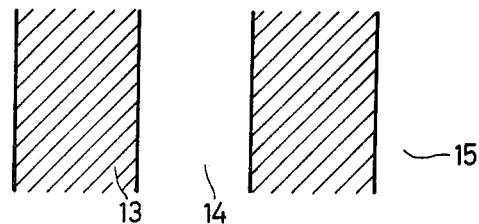

FIGS. 3 and 4 show an example of an application of the present invention. In FIG. 3, indicated at 11 is an image portion and at 12 a signal portion on the rotary member 7. Indicated at 6a, 6b, 6c, ... in FIG. 4A are individual sensors, while reference numeral 13 in FIG. 4B indicates a line image, 14 a background, and 15 an original image.

The rotary member 7 includes the image portion 11 and the signal portion 12 formed with a minimum width and on which there is provided a sensor array 6 composed of individual sensor elements 6a, 6b, 6c, . . . . On the signal portion 12 is formed the image a line pattern to be measured.

A line latent image formed on the rotary member 7 is too large for any one of the individual sensor 6a, 6b, 6c, . . . , as is apparent from FIGS. 4A and 4B. The maximum value of the drain current $I_D$ from plural ones of the sensors is detected and the level of electric charge on the rotary member is obtained based on the maximum value of the drain current thus detected. The level of electric charge thus obtained corresponds to the line image density of the latent image.

As is apparent from the foregoing, a recess is provided in the surface of the substrate which forms the rotary member and a charge level sensor is provided between the recess and an electric-charge retaining layer formed on the substrate surface. With such arrangement, the distance between the sensor and the sample is maintained substantially constant and the sensor is maintained free from strain and is protected against contamination by foreign matter. Furthermore, the sensor is greatly reduced in size compared with prior art devices of this general type.

What is claimed is:

1. An electrostatic copier with a charge level sensor comprising: a substrate formed as a rotary member, at least one recess being formed in said substrate; a semiconductor sensor provided in said recess in said substrate; and an electric-charge retaining layer formed over the surface of said substrate and said semiconductor sensor in said recess.

2. The charge level sensor of claim 1 wherein a plurality of said recesses are formed in a predetermined pattern in said surface of said substrate and wherein a sensor is disposed in each of said recesses.

3. The charge level sensor of claim 1 wherein said sensor comprises a MOS FET transistor.

4. The charge level sensor of claim 1 wherein holes are provided extending through said substrate from said recess for leading out an electrical conductor coupled to said sensor.

5. The charge level sensor of claims 1, 2, 3 or 4 wherein said substrate is formed of aluminum.

6. The charge level sensor of claims 1, 2, 3 or 4 wherein said electric-charge retaining layer comprises a material selected from the group consisting of photosensitive materials and dielectric materials.

7. The charge level sensor of claim 2, wherein each sensor comprises a MOS FET transistor.

8. The charge level sensor of claim 2, wherein said predetermined pattern is disposed parallel to the axis of rotation of said rotary member.

9. The charge level sensor of claim 3, wherein said FET is formed with a source and a drain disposed in said recess and a gate region is contiguous to and directly responsive to the charge existing in said electric-charge retaining layer.

10. The charge level sensor of claim 1, wherein said semiconductor sensor comprises an active device having source and drain elements disposed in said recess and a gate element therebetween contiguous to and directly responsive to the charge existing in the electric-charge retaining layer.

* * * * *